US012770543B2

(12) United States Patent
Hu

(10) Patent No.: US 12,770,543 B2
(45) Date of Patent: Oct. 20, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Kai Hu, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 18/414,491

(22) Filed: Jan. 17, 2024

(65) Prior Publication Data

US 2024/0153427 A1 May 9, 2024

Related U.S. Application Data

(63) Continuation of application No. 18/086,336, filed on Dec. 21, 2022, now Pat. No. 11,908,368.

(30) Foreign Application Priority Data

Aug. 11, 2022 (CN) ......................... 202210962481.9

(51) Int. Cl.

*G09G 3/20* (2006.01)
*H10K 50/125* (2023.01)

(Continued)

(52) U.S. Cl.

CPC ......... *G09G 3/2003* (2013.01); *H10K 50/125* (2023.02); *H10K 50/81* (2023.02);

(Continued)

(58) Field of Classification Search

CPC . H10K 59/35; H01L 27/3244; H01L 27/3225; H01L 27/3227; H01L 27/3234

See application file for complete search history.

(56) References Cited

U.S. PATENT DOCUMENTS

2021/0065625 A1* 3/2021 Wang .................. G09G 3/3233
2021/0397806 A1* 12/2021 Lu ........................ G06V 10/143

(Continued)

FOREIGN PATENT DOCUMENTS

CN 111625121 A * 9/2020 ........... G06F 3/0412

*Primary Examiner* — Yuzhen Shen

(74) *Attorney, Agent, or Firm* — PV IP PC; Peter Stecher; Wei Te Chung

(57) ABSTRACT

A display panel includes: a first display region; a component region surrounded by the first display region, wherein the component region includes at least one transmission region and at least one second display region surrounding the transmission region; one or more first sub-pixels disposed in the first display region; one or more second sub-pixels disposed in the second display region; a black matrix layer disposed in the first and second display regions and comprising a first opening overlapping the first sub-pixel in the first display region, a second opening overlapping the second sub-pixel in the second display region, and a third opening without overlapping the first pixel and the second pixel; and a touch wire disposed in the first display region and the second display region, and surrounding the first, second, and third openings.

18 Claims, 5 Drawing Sheets

(51) Int. Cl.

| | |
|---|---|
| ***H10K 50/81*** | (2023.01) |
| ***H10K 50/82*** | (2023.01) |
| ***H10K 50/856*** | (2023.01) |
| ***H10K 77/10*** | (2023.01) |
| *H10K 102/00* | (2023.01) |

(52) U.S. Cl.
CPC ........... *H10K 50/82* (2023.02); *H10K 50/856* (2023.02); *H10K 77/10* (2023.02); *G09G 2310/0237* (2013.01); *H10K 2102/3035* (2023.02)

(56) References Cited

U.S. PATENT DOCUMENTS

2022/0067340 A1* 3/2022 Han .................... G06V 40/1365
2023/0022216 A1* 1/2023 Jeon ..................... H10K 59/131
2023/0157094 A1* 5/2023 Li .......................... G06F 3/0421
345/174

* cited by examiner

DISPLAY PANEL AND DISPLAY DEVICE

CROSS-REFERENCE TO RELATED APPLICATION

This application is a continuation application of U.S. application Ser. No. 18/086,336, filed on Dec. 21, 2022, which is based on and claims priority under 35 U.S.C. § 119 to China Patent Application No. 202210962481.9, filed on Aug. 11, 2022, in the China National Intellectual Property Administration, the disclosure of which is incorporated by reference herein in its entirety.

TECHNICAL FIELD

The present disclosure relates to a field of display technology, and more particularly, to a display panel and a display device.

BACKGROUND

In current organic light-emitting diode (OLED) panels, polarizer free (Pol-less) technology is commonly used in the art to reduce power consumption of a panel. However, since no polarizer suppresses reflection of external light, the reflection of a surface of the panel is very serious under the irradiation of the external light.

When the Pol-less technology and the camera under panel (CUP) technology are combined, a light transmission region, a transition region disposed around the light transmission region, and a display region disposed around the transition region are disposed in a region of the panel corresponding to a camera. A black matrix is disposed in both the transition region and the display region, to shield metal wires. an area of a light-emitting pixel in the transition region is smaller than that of the light-emitting pixel in the display region, thereby causing the dimmer transition region when the panel is screen-off and screen-on.

SUMMARY

An embodiment of the present disclosure provides a display panel and a display device, which can improve the dimmer transition region when the panel is screen-off and screen-on.

An embodiment of the present disclosure provides a display panel including a light transmission region, a transition region, and a display region, wherein the display region is disposed on at least one side of the light transmission region, the transition region is disposed between the light transmission region and the display region, and the light transmission region is arranged to correspond to an external photosensitive device, wherein the display panel further includes:

- a substrate;
- a drive structure layer disposed on the substrate;
- a light-emitting layer disposed on a side of the drive structure layer away from the substrate, wherein the light-emitting layer includes a plurality of first sub-pixels and a plurality of second sub-pixels, the first sub-pixels are disposed in the display region and the second sub-pixels are disposed in the transition region;
- a black matrix layer disposed on a side of the light-emitting layer away from the substrate, wherein a plurality of first openings, a plurality of second openings and a plurality of third openings are disposed in the black matrix layer, the first openings are located in the display region, and the first openings respectively corresponds to the first sub-pixels, the second openings and the third openings are disposed in the transition region, the second openings respectively corresponds to the second sub-pixels, and the third openings are disposed outside the second openings; and
- a color film layer disposed on a side of the light-emitting layer away from the substrate, wherein the color film layer includes a plurality of first color photoresists and a plurality of second color photoresists, the first color photoresists are disposed in the display region, and the first color photoresists are disposed in the first openings, the second color photoresists are disposed in the transition region, and the second color photoresists are disposed in the second openings, and
- wherein the display panel further includes a reflection structure disposed on a side of the black matrix layer close to the substrate, and the reflection structure is disposed to directly face the third openings.

Alternatively, in some embodiments of the present disclosure, the display panel further includes touch electrodes, wherein the touch electrodes are disposed on a side of the light-emitting layer away from the substrate and correspond to (disposed in) the display region and the transition region, the black matrix layer shields the touch electrodes, and each of the touch electrodes includes first touch wires, second touch wires, third touch wires, and fourth touch wires, and wherein each of the first touch wires is disposed surrounding each of the second openings, each of the second touch wires is disposed surrounding each of the third openings, each of the third touch wires is connected between a corresponding one of the first touch wires and a corresponding one of the second touch wires, and each of the fourth touch wires is connected between two adjacent ones of the first touch wires.

Alternatively, in some embodiments of the present disclosure, the reflection structure includes at least one of a plurality of conductive film layers between the substrate and the black matrix layer.

Alternatively, in some embodiments of the present disclosure, the display panel further includes a cathode disposed on a side of the light-emitting layer away from the substrate, and the reflection structure further includes a portion of the cathode corresponding to the third openings.

Alternatively, in some embodiments of the present disclosure, the reflection structure includes a wire formed in the drive structure layer, and a portion of the wire is disposed to directly face the third openings.

Alternatively, in some embodiments of the present disclosure, the wires include at least one of a gate wire, a source/drain wire, a signal connection wire, and a transparent connection wire.

Alternatively, in some embodiments of the present disclosure, the display panel further includes an anode layer and a pixel definition layer, wherein the anode layer is disposed on a side of the drive structure layer away from the substrate, the pixel definition layer is disposed on the side of the drive structure layer away from the substrate, the pixel definition layer covers a portion of the anode layer, and the reflection structure further includes reflection parts, wherein the anode layer includes anodes disposed in the same layer as the reflection parts, and the anodes and the reflection parts are disposed spaced apart from each other, pixel holes are formed in the pixel definition layer, the pixel holes respectively expose the anodes, and the light-emitting layer is disposed within the pixel holes, and;

wherein an orthographic projection of each of the reflection parts on a plane in which the substrate is located is located inside an orthographic projection of an outline of each of the third openings on the plane in which the substrate is located.

Alternatively, in some embodiments of the present disclosure, contact holes are disposed in the pixel definition layer, the contact holes respectively expose the reflection parts, and the cathode covers the pixel definition layer and is connected to the reflection parts through the contact holes.

Alternatively, in some embodiments of the present disclosure, microstructures are formed on one side of each of the reflection parts away from the substrate.

Alternatively, in some embodiments of the present disclosure, the plurality of the third openings are arranged spaced apart from one another along a circumferential direction of the light transmission region.

Alternatively, in some embodiments of the present disclosure, in the transition region, opening areas of the respective third openings decrease in a direction from the display region to the light transmission region.

Alternatively, in some embodiments of the present disclosure, the light-emitting layer further includes a plurality of third sub-pixels disposed in the light transmission region, among the first sub-pixels, the second sub-pixels, and the third sub-pixels that emit a same color light, a light-emitting area of each of the first sub-pixels is larger than the light-emitting area of each of the second sub-pixels, and the light-emitting area of each of the second sub-pixels is larger than or equal to the light-emitting area of each of the third sub-pixels, wherein fourth openings and fifth openings are further disposed in the black matrix layer in the light transmission region, the fourth openings and the fifth openings are spaced apart from each other, each of the fifth openings respectively surrounds each of the fourth openings for transmitting external light, the fourth openings respectively correspond to the third sub-pixels, and wherein the color film layer further includes a plurality of third color photoresists respectively disposed within the fourth openings.

Alternatively, in some embodiments of the present disclosure, a portion of the second sub-pixels closest to the light transmission region are defined as first edge sub-pixels and a portion of the third sub-pixels closest to the transition region are defined as second edge sub-pixels, wherein the black matrix layer includes a first light-shielding portion located in the transition region and a second light-shielding portion located in the light transmission region, each of the second light-shielding portions is disposed surrounding each of the third sub-pixels, peripheries of the first light-shielding portions close to the light transmission region are used as a border between the light transmission region and the transition region, and wherein among the first edge sub-pixels and the second edge sub-pixels that emit a same color light, a distance between a periphery of one of the first edge sub-pixels and the border is smaller than or equal to a distance between a periphery of one of the second edge sub-pixels and a periphery of the second light-shielding portions.

Accordingly, an embodiment of the present disclosure further provides a display device including a photosensitive device and a display panel according to any one of the above embodiments, wherein the photosensitive device is disposed at a rear of the display panel and corresponds to the light transmission region.

In the display device according to embodiments of the present disclosure, the third openings are disposed in a region of the black matrix layer corresponding to the transition region, so that the external light can be reflected by the reflection structure through the third openings, to form reflected light, thereby increasing the light reflectivity of the transition region and improving the dimmer transition region when the panel is screen-off and screen-on.

BRIEF DESCRIPTION OF THE DRAWINGS

In order for more clearly illustrating technical solutions according to embodiments of the present disclosure, the accompanying drawings used for the description of the embodiments will be briefly described below. It will be apparent that the accompanying drawings in the description below are merely some of the embodiments in the present disclosure, and additional drawings may be obtained from these accompanying drawings by those skilled in the art without involving any inventive effort.

Figure 1:
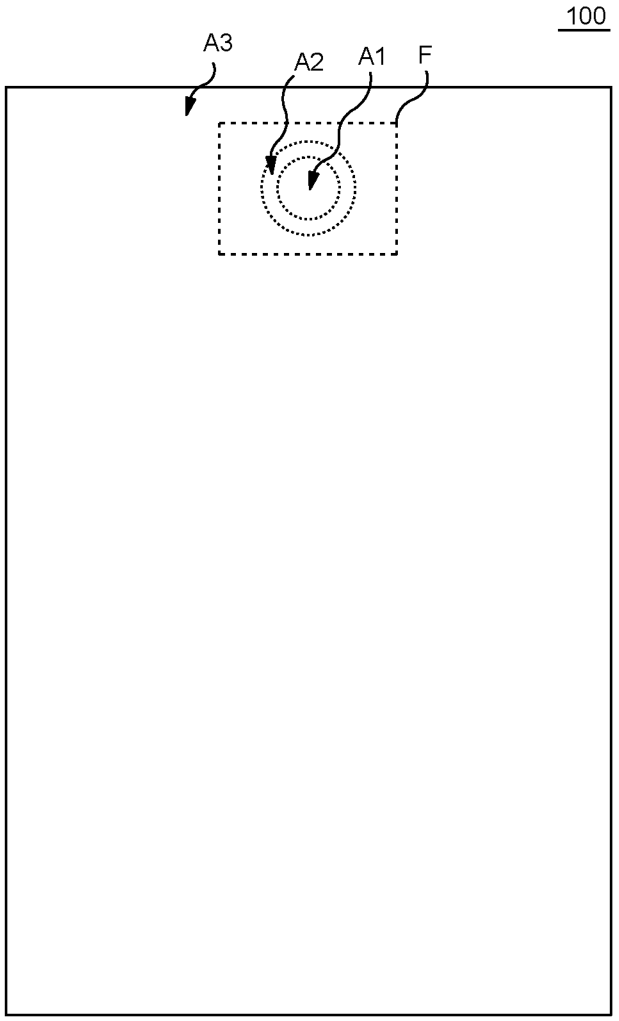
FIG. 1 is a schematic top view of a display panel according to an embodiment of the present disclosure.

Description: in the light transmission region A1, B represents a blue third sub-pixel, R represents a red third sub-pixel, and G represents a green third sub-pixel; in the transition region A2, B represents a blue second sub-pixel, R represents a red second sub-pixel, and G represents a green second sub-pixel; and in the display region A3, B represents a blue first sub-pixel, R represents a red first sub-pixel, and G represents a green first sub-pixel.

DESCRIPTION OF SPECIFIC EMBODIMENTS OF THE INVENTION

Technical solutions in embodiments of the present disclosure will be clearly and completely described in connection with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the application. In the present disclosure, if not stated to the contrary, the use of positional terms such as such as “up” and/or “down” usually refer to “up” and/or “down” in the actual use or working state of the device, specifically the drawing direction in the figure. Positional terms such as “inside” and “outside” are provided with respect to the outline of the device.

In an embodiment of the present disclosure, a display panel and a display device are provided, which are described in detail below. It should be noted that the order in which the following embodiments are described is not intended to limit the preferred order of the embodiments.

Embodiment 1

Figure 2:
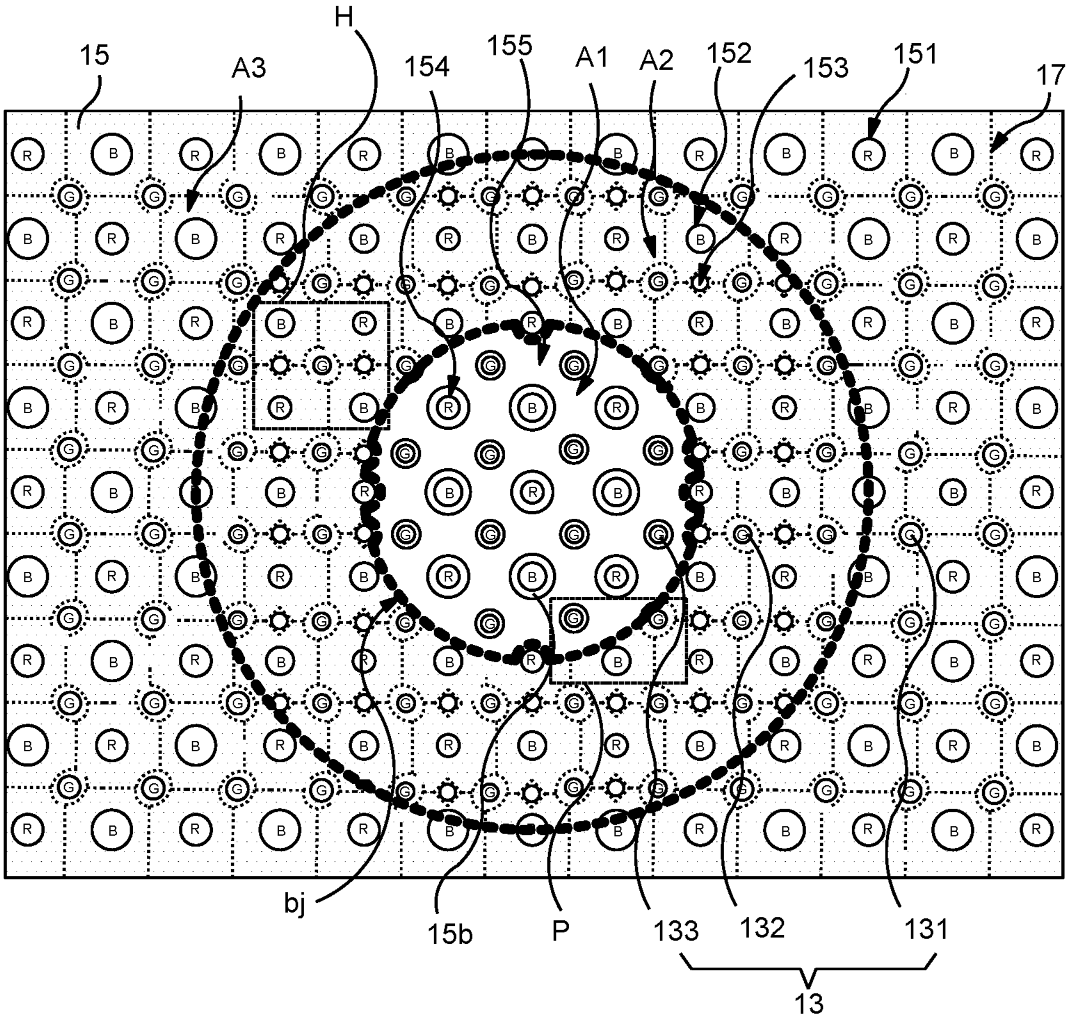
FIG. 2 is an enlarged view of part F in FIG. 1.
Figure 3:
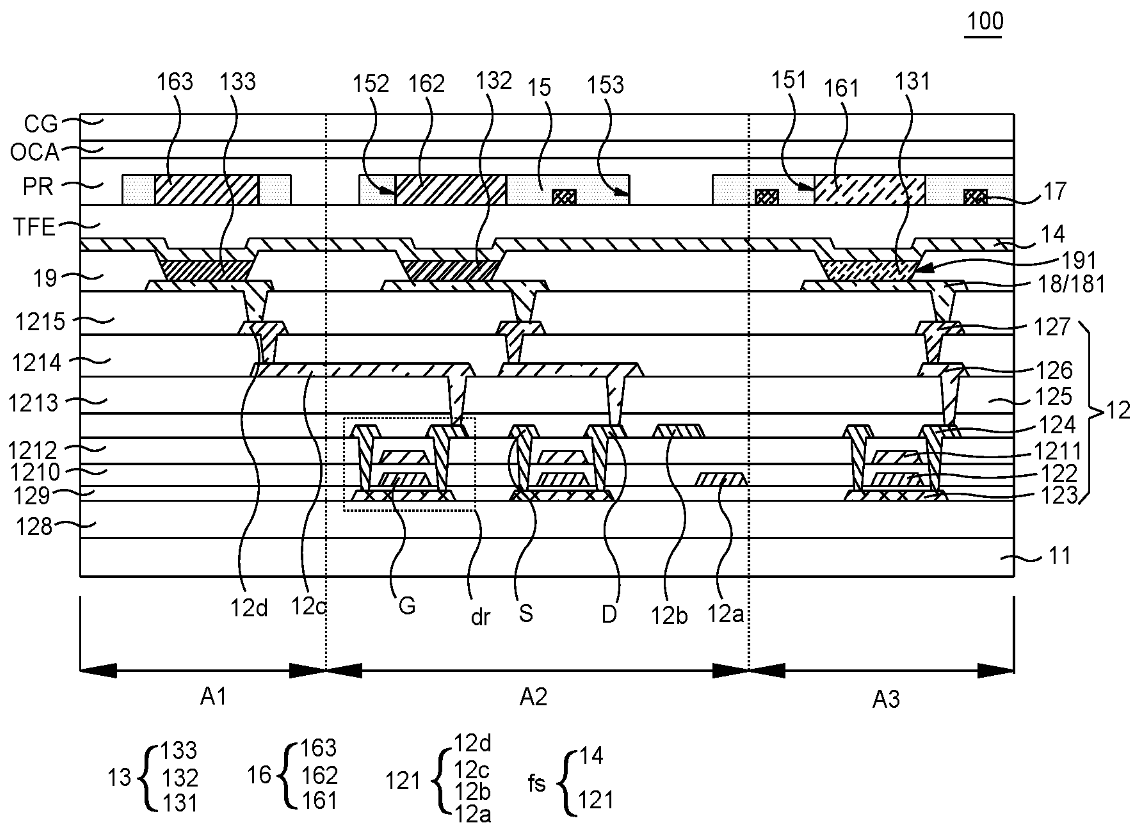
FIG. 3 is a schematic sectional view of a display panel according to an embodiment of the present disclosure.

Referring to FIGS. 1, 2, and 3, in Embodiment 1 of the present disclosure, a display panel 100 is provided. The display panel 100 includes a light transmission region A1, a transition region A2, and a display region A3. The display region A3 is disposed on at least one side of the light transmission region A1. The transition region A2 is disposed between the light transmission region A1 and the display region A3. The light transmission region A1 is arranged to correspond to (or overlap in a direction perpendicular to an upper surface of the substrate) an exterior photosensitive device. The display panel 100 includes a substrate 11, a drive structure layer 12, a light-emitting layer 13, a cathode 14, a black matrix layer 15, and a color film layer 16.

A drive structure layer 12 is disposed on the substrate 11. The light-emitting layer 13 is disposed on a side of the drive structure layer 12 away from the substrate 11. The light-emitting layer 13 includes a plurality of first sub-pixels 131 and a plurality of second sub-pixels 132. The first sub-pixels 131 are disposed in the display region A3. The second sub-pixels 132 are disposed in the transition region A2.

The black matrix layer 15 is disposed on a side of the light-emitting layer 13 away from the substrate 11. First openings 151, second openings 152, and third openings 153 are disposed in the black matrix layer 15. The first openings 151 are located in the display region A3. The first openings 151 respectively correspond to (or overlap in the direction perpendicular to the upper surface of the substrate) the first sub-pixels 131. The second openings 152 and the third openings 153 are disposed in the transition region A2. The second openings 152 respectively correspond to the second sub-pixels 132. Each of the third openings 153 is disposed outside of and near each of the second opening 152.

The color film layer 16 is disposed on the side of the light-emitting layer 13 away from the substrate 11. The color film layer 16 includes a plurality of first color photoresists 161 and a plurality of second color photoresists 162. The first color photoresists 161 are disposed in the display region A3. Each of the first color photoresists 161 is disposed in each of the first openings 151. The second color photoresists 162 is disposed in the transition region A2. Each of the second color photoresists 162 is disposed in each of the second openings 152.

The display panel 100 includes a reflection structure fs disposed on a side of the black matrix layer 15 close to the substrate 11. The reflection structure fs is disposed to directly face the third openings 153.

It should be noted that, in the related art, since a light-emitting area per unit area in the transition region is smaller than a light-emitting area per unit area in the display region. For example, among the sub-pixels emitting the same color light, an area of the sub-pixels per unit area in the transition region is smaller than that of the sub-pixels per unit area in the display region. Alternatively, a density of the sub-pixels per unit area in the transition region is smaller than a density of the sub-pixels per unit area in the display region. Alternatively, among the sub-pixels emitting the same color light, an area of the sub-pixels per unit area in the transition region is smaller than that of the sub-pixels per unit area in the display region, and a density of the sub-pixels per unit area in the transition region is smaller than a density of the sub-pixels per unit area in the display region. Thus, in the case of lighting or screen-off, the transition region is darker than the display region.

Therefore, in the display panel 100 according to Embodiment 1 of the present disclosure, third openings 153 are disposed in an region of the black matrix layer 15 corresponding to the transition region A2, so that external light may be reflected by the reflection structure fs through the third openings 153, to form reflected light, and the reflected light is emitted through the third openings 153, thereby increasing the light reflectivity of the transition region A2, increasing the brightness of the transition region A2, and improving the dimmer transition region when the panel is screen-off and screen-on.

Alternatively, the reflection structure fs includes at least one of a plurality of conductive film layers between the substrate 11 and the black matrix layer 15. That is, the reflection structure fs may include one conductive film layer, or may include two or more conductive film layers disposed respectively in different layers. The plurality of conductive film layers may include the cathode 14, an anode layer 18, a gate metal layer (first metal layer) 122, a source/drain metal layer (second metal layer) 124, a third metal layer 1211, or other transparent conductive film layers (such as 126 and 127).

It should be noted that since the surface of each of the conductive film layers may be smooth, and thus may reflect light.

In some embodiments, the reflection structure fs may also be a stacked structure of the plurality of transparent film layers between the substrate 11 and the black matrix layer 15, and a stacked interface between the plurality of transparent film layers is a total reflection surface.

Alternatively, the display panel 100 further includes the cathode 14 disposed on the side of the light-emitting layer 13 away from the substrate 11. The reflection structure fs includes a portion of the cathode 14 corresponding to the third openings 153.

The cathode 14 has a semi-reflective and semi-transmissive property, and among the conductive film layers, the cathode 14 is closest to the third openings 153. Therefore, the cathode 14 is used as a part of the reflection structure fs, so that light is not excessively reflected on the cathode 14, thereby improving the visibility of the display.

It will be appreciated that since the cathode 14 is a planar (or two-dimension) structure, Embodiment 1 may adjust the brightness of the transition region A2 by adjusting the size and number of the third openings 153.

Alternatively, a material of the cathode 14 includes at least one of Ag, Mg, Yb, Al, Ga, Cu, Au, and a metal oxide. Alternatively, the light-emitting area within the unit area in the transition region A2 is smaller than the light-emitting area within the unit area in the display region A3.

The light-emitting layer 13 includes a plurality of third sub-pixels 133 disposed in the light transmission region A1.

The first sub-pixels 131 include red first sub-pixels, green first sub-pixels, and blue first sub-pixels. The second sub-pixels 132 include red second sub-pixels, green second sub-pixels, and blue second sub-pixels. The third sub-pixels 133 include red third sub-pixels, green third sub-pixels, and blue third sub-pixels.

Among the first sub-pixels 131, the second sub-pixels 132, and the third sub-pixels 133 emitting the same color light, the light-emitting area of each of the first sub-pixels 131 is larger than the light-emitting area of each of the second sub-pixels 132, and the light-emitting area of each of the second sub-pixels 132 is larger than or equal to the light-emitting area of each of the third sub-pixels 133.

For example, the light-emitting area of each of the red first sub-pixels 131 is larger than the light-emitting area of each of the red second sub-pixels 132, and the light-emitting area of each of the red second sub-pixels 132 is larger than or equal to the light-emitting area of each of the red third sub-pixels 133.

Fourth openings 154 and fifth openings 155 are disposed in the black matrix layer 15. The fourth openings 154 and the fifth openings 155 are spaced apart from each other and located in the light transmission region A1. Each fifth opening 155 surrounds each fourth opening 154 for transmitting the external light. The fourth openings 154 respectively correspond to the third sub-pixels 133.

The color film layer 16 includes a plurality of third color photoresists 163 respectively disposed within the fourth openings 154.

In the display region A3, the first color photoresists 161 are disposed one-to-one above the first sub-pixels 131, and each of the first color photoresists 161 and the first sub-pixel 131 underneath it have the same color. In the transition region A2, the second color photoresists 162 are disposed one-to-one above the second sub-pixels 132, and each of the second color photoresists 162 and the second sub-pixel 132 underneath it have the same color. In the light transmission region A1, the third color photoresists 163 are disposed one-to-one above the third sub-pixels 133, and each of the third color photoresists 163 and the third sub-pixel 133 underneath it have the same color.

In addition, in some embodiments, the light-emitting layer 13 and/or the black matrix layer 15 are not disposed in the light transmission region A1. That is, compared with Embodiment 1, the light transmission region A1 does not include the third sub-pixel 133 and/or the black matrix layer 15. For example, a hole is formed in the light transmission region A1.

Alternatively, the plurality of third openings 153 are arranged spaced apart from one another along a circumferential direction of the light transmission region A1, so that the brightness of the transition region A2 in the circumferential direction tends to be uniform.

Alternatively, in the transition region A2, opening areas of the respective third openings 153 decrease in a direction from the display region A3 towards the light transmission region A1. With such an arrangement, the transition region A2 is in a gradual trend, which appropriately reduces the aperture ratio of the transition region A2.

Alternatively, in some embodiments, the area of the third openings 153 may be unchanged in the transition region A2.

Alternatively, the third openings 153 may have circular, elliptical, polygonal, or other shape.

Alternatively, a pitch between the centers of the first sub-pixels 131, a pitch between the centers of the second sub-pixels 132, and a pitch between the centers of the third sub-pixels 133 are same as each other.

Figure 4:
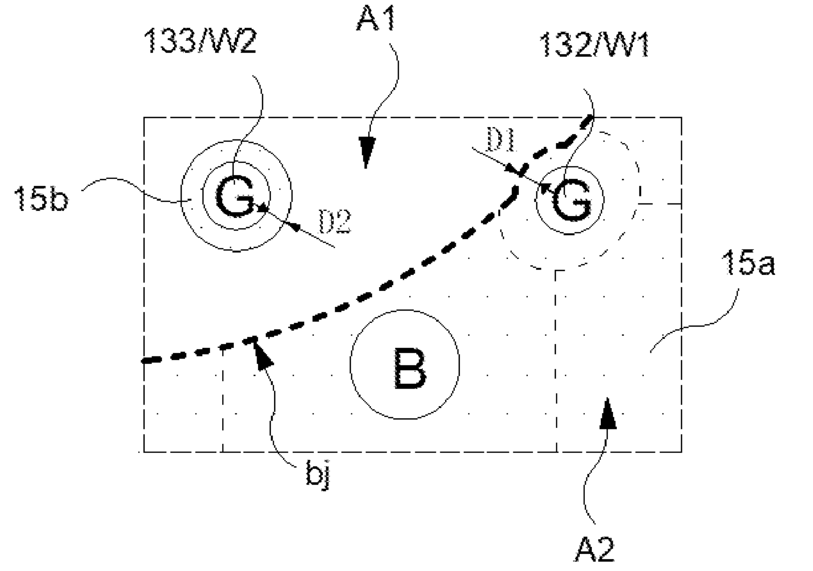
FIG. 4 is an enlarged view of part P in FIG. 2.

Referring to FIG. 4, alternatively, a portion of the second sub-pixels 132 closest to the light transmission region A1 are defined as first edge sub-pixels W1. A portion of the third sub-pixels 133 closest to the transition region A2 are defined as second edge sub-pixels W2.

The black matrix layer 15 includes a first light-shielding portions 15*a* located in the transition region A2 and a second light-shielding portions 15*b* located in the light transmission region A1. Each of the second light-shielding portions 15*b* is disposed surrounding each of the third sub-pixels 133. Peripheries of the first light-shielding portions 15*a* close to the light transmission region A1 are used as a border bj between the light transmission region A1 and the transition region A2.

Among the first edge sub-pixels W1 and the second edge sub-pixels W2 which emit the same color light, a distance D1 between the periphery of one of the first edge sub-pixels W1 and the border bj is smaller than or equal to a distance D2 between the periphery of one of the second edge sub-pixels W2 and the periphery of the second light-shielding portions 15*b*.

Such an arrangement can improve the brightness uniformity of the display panel along a direction from the light transmission region A1 to the transition region A2.

Alternatively, the display panel 100 further includes touch electrodes 17. The touch electrodes 17 are disposed on the side of the light-emitting layer 13 away from the substrate 11 and correspond to (are disposed in) the display region A3 and the transition region A2. The black matrix layer 15 shields the touch electrodes 17.

Figure 5:
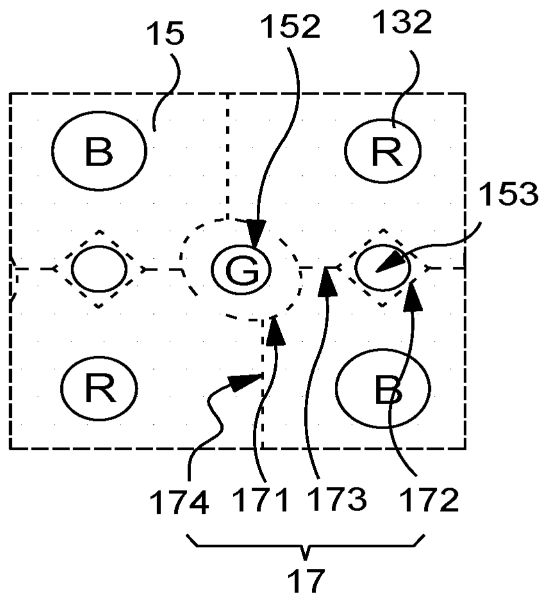
FIG. 5 is an enlarged view of part H in FIG. 2.

Referring to FIG. 5, each of the touch electrodes 17 includes first touch wires 171, second touch wires 172, third touch wires 173, and fourth touch wires 174.

Each of the first touch wires 171 is disposed surrounding each of the second openings 152. Each of the second touch wires 172 is disposed surrounding each of the third openings 153. Each of the third touch wires 173 is connected between a corresponding one of the first touch wires 171 and a corresponding one of the second touch wires 172. Each of the fourth touch wires 174 is connected between two adjacent first touch wires 171.

That is, the touch electrodes 17 has a grid shape. The grid wires of the touch electrodes 17 are disposed to bypass the third openings 153.

Alternatively, referring to FIG. 3, the drive structure layer 12 includes a plurality of pixel driving circuits dr. Each of the first sub-pixels 131, the second sub-pixels 132, and the third sub-pixels 133 corresponds to each of the pixel driving circuits dr. Each of the pixel driving circuits dr includes a plurality of thin film transistors, capacitors, signal wires, and/or the like. Alternatively, the thin film transistor may be one of a top gate type, a bottom gate type, and a double gate type.

The pixel driving circuits dr are disposed in both the transition region A2 and the display region A3, but no pixel driving circuit is disposed in the light transmission region A1.

The pixel driving circuits dr respectively driving the third sub-pixels 133 are disposed in the transition region A2. In this embodiment, the pixel driving circuits dr driving and corresponding to the third sub-pixels 133 are disposed in the transition region A2, to improve the light transmittance of the light transmission region A1.

In addition, in the transition region A2, a plurality of pixel driving circuits dr may be concentrated in an island shape, to form a pixel driving island. Compared with dispersed pixel driving circuits, a layout space is saved in the embodiment of the present disclosure. Alternatively, a plurality of pixel driving islands are arranged along the circumferential direction of the light transmission region A1.

Alternatively, the pixel driving circuits dr respectively driving the second sub-pixels 132 are further disposed in the transition region A2. The pixel driving circuits dr respectively driving the first sub-pixels 131 are disposed in the display region A3.

In this embodiment, the reflection structure fs further includes a wire 121 formed in the drive structure layer 12. A portion of the wire 121 is disposed to directly face the third openings 153 (that is, be overlapped with the third openings 153 in the direction perpendicular to the upper surface of the substrate).

Since the surface of the wire 121 is relatively smooth, when the external light is transmitted through the third openings 153 and the cathode 14 and radiated onto the wire 121, a portion of the external light is reflected by the surface of the wire 121, thereby improving the reflectivity of the transition region A2.

In some embodiments, the reflection structure fs may also not include portions of the cathode 14 as compared to the present embodiment. That is, holes corresponding to the third openings are formed in the cathode layer, and the wiring 121 is used to reflect the external light toward the third openings 153.

Alternatively, the wire 121 includes at least one of a gate wire 12*a*, a source/drain wire 12*b*, a signal connection wire 12*c*, or a transparent connection wire 12*d*, for example, a scan wire, a common wire, a data wire, a power wire, a replacement wire, a connection wire, or the like.

In some embodiments, where the degree of light reflection of the cathode 14 is appropriate, the wires 121 may be disposed outside the third openings 153, that is, the wires of the drive structure layer 12 may all bypass the third openings 153.

Alternatively, the drive structure layer 12 includes the first metal layer 122, a semiconductor layer 123, the second metal layer 124, a planarization layer 125, a first transparent conductive film layer 126, and a second transparent conductive film layer 127.

The first metal layer 122 is disposed on the substrate 11. The first metal layer 122 includes a gate G and a gate wire 12*a*. The gate wire 12*a* includes the same material as the gate G. The gate wire 12*a* and the gate G may be manufactured using a same mask.

The semiconductor layer 123 is disposed in a layer different from the first metal layer 122. The semiconductor layer 123 is provided to overlap the gate G.

The second metal layer 124 is disposed on a side of the first metal layer 122 and the semiconductor layer 123 away from the substrate 11. The second metal layer 124 includes a source S, a drain D, and a source/drain wire 12*b*. The source/drain wire 12*b* includes the same material as the source S. The source/drain wires 12*b* and the source S may be manufactured using a same mask.

A planarization layer 125 is disposed on a side of the second metal layer 124 away from the substrate 11. The first transparent conductive film layer 126 is disposed on a side of the planarization layer 125 away from the planarization layer 125. The first transparent conductive film layer 126 includes the signal connection wire 12*c*.

A second transparent conductive film layer 127 is disposed on a side of the first transparent conductive film layer 126 away from the substrate 11. The second transparent conductive film layer 127 is disposed in a layer different from the first transparent conductive film layer 126. The second transparent conductive film layer 127 includes the transparent connection wires 12*d*.

A portion of at least one of the gate wire 12*a*, the source/drain wire 12*b*, the signal connection wire 12*c*, and the transparent connection wire 12*d* is disposed to directly face the third openings 153 (that is, be overlapped with the third openings 153 in the direction perpendicular to an upper surface of the substrate).

It should be noted that a portion of at least one of the gate wire 12*a*, the source/drain wire 12*b*, the signal connection wire 12*c*, and the transparent connection wire 12*d* is disposed to directly face the third openings 153. For example, one of the gate wire 12*a*, the source/drain wire 12*b*, the signal connection wire 12*c*, and the transparent connection wire 12*d* may be disposed to correspond to the third openings 153. That is, a single kind of wire 121 is used as a reflector to reflect the external light. Alternatively, two or three of the gate wire 12*a*, the source/drain wire 12*b*, the signal connection wire 12*c*, and the transparent connection wire 12*d* may be disposed to correspond to the third openings 153. That is, a variety of the wires 121 may be used as the reflector to reflect the external light.

In addition, since conductive film layers of the drive structure layer 12 has a plurality of layers, when the wires (12*a*, 12*b*, 12*c*, and 12*d*) in different layers correspond to the third openings 153, a scattering effect occurs, over-reflection can be reduced, and visibility can be improved.

In addition, in Embodiment 1, a top-gate type thin film transistor is illustrated as an example, but is not limited thereto.

The drive structure layer 12 further includes a buffer layer 128, a first insulation layer 129, a second insulation layer 1210, a third metal layer 1211, a third insulation layer 1212, a fourth insulation layer 1213, a fifth insulation layer 1214, and a sixth insulation layer 1215.

The buffer layer 128 is disposed on the substrate 11. The semiconductor layer 123 is disposed on the buffer layer 128. The first insulation layer 129 is disposed on the buffer layer 128 and covers the semiconductor layer 123. The first metal layer 122 is disposed on the first insulation layer 129. The second insulation layer 1210 is disposed on the first insulation layer 129 and covers the first metal layer 122. The third metal layer 1211 is disposed on the second insulation layer 1210. The third insulation layer 1212 is disposed on the second insulation layer 1210 and covers the third metal layer 1211. The second metal layer 124 is disposed on the third insulation layer 1212. The planarization layer 125 is disposed on the third insulation layer 1212 and covers the second metal layer 124. The fourth insulation layer 1213 is disposed on the planarization layer 125. The first transparent conductive film layer 126 is disposed on the fourth insulation layer 1213. The fifth insulation layer 1214 is disposed on the fourth insulation layer 1213 and covers the first transparent conductive film layer 126. The second transparent conductive film layer 127 is disposed on the fifth insulation layer 1214. The sixth insulation layer 1215 is disposed on the fifth insulation layer 1214 and covers the second transparent conductive film layer 127.

Alternatively, the buffer layer 128 may be a single layer structure or may be a stacked structure of multiple layers. The semiconductor layer 123 may include a silicon-based or metal oxide semiconductor material. Each of the first metal layer 122, the second metal layer 124, and the third metal layer 1211 may include one of gold, silver, copper, tungsten, molybdenum, iron, aluminum, titanium, or the like, or an alloy thereof. Each of the first metal layer 122, the second metal layer 124, and the third metal layer 1211 may have a single-layer structure or a stacked structure of multiple layers.

Each of the first transparent conductive film layer 126 and the second transparent conductive film layer 127 may include metal oxide materials such as indium tin oxide and indium zinc oxide.

With continued reference to FIG. 3, the display panel 100 further includes the anode layer 18 and a pixel definition layer 19. The anode layer 18 is disposed on the side of the drive structure layer 12 away from the substrate 11. Specifically, the anode layer 18 is disposed on the sixth insulation layer 1215.

The pixel definition layer 19 is disposed on the side of the drive structure layer 12 away from the substrate 11. Specifically, the pixel definition layer 19 is disposed on the sixth insulation layer 1215. The pixel definition layer 19 covers a portion of the anode layer 18.

The anode layer 18 includes anodes 181. Pixel holes 191 are formed in the pixel definition layer 19. The pixel holes 191 respectively expose the anodes 181, that is, elements to be filled into the pixel holes 191 may be contact the anodes 181 through the pixel holes 191, and the word "expose" below has the same meaning herein. The light-emitting layer 13 are disposed within the pixel holes 191.

The anodes 181 are connected to the transparent connection wires 12*d*, and the transparent connection wires 12*d* are connected to the signal connection wires 12*c*. The signal connection wires 12*c* are respectively connected to the pixel driving circuits dr.

In some embodiments, the anodes 181 may be connected to the transparent connection wire 12*d*, and the transparent connection wire 12*d* may be connected to the pixel driving circuits dr. Alternatively, the anodes 181 are connected to the signal connection wires 12*c*, and the signal connection wires 12*c* are connected to the pixel driving circuits dr.

Alternatively, the display panel 100 may further include an encapsulation layer TFE, a protection layer PR, an optical adhesive OCA, and a cover plate CG.

The encapsulation layer TFE is disposed on the cathode 14. The black matrix layer 15 and the color film layer 16 are disposed on the encapsulation layer TFE. The protection layer PR covers the black matrix layer 15 and the color film layer 16. The optical adhesive OCA is disposed on the protection layer PR. The cover plate CG is disposed on the protection layer PR.

Embodiment 2

Figure 6:
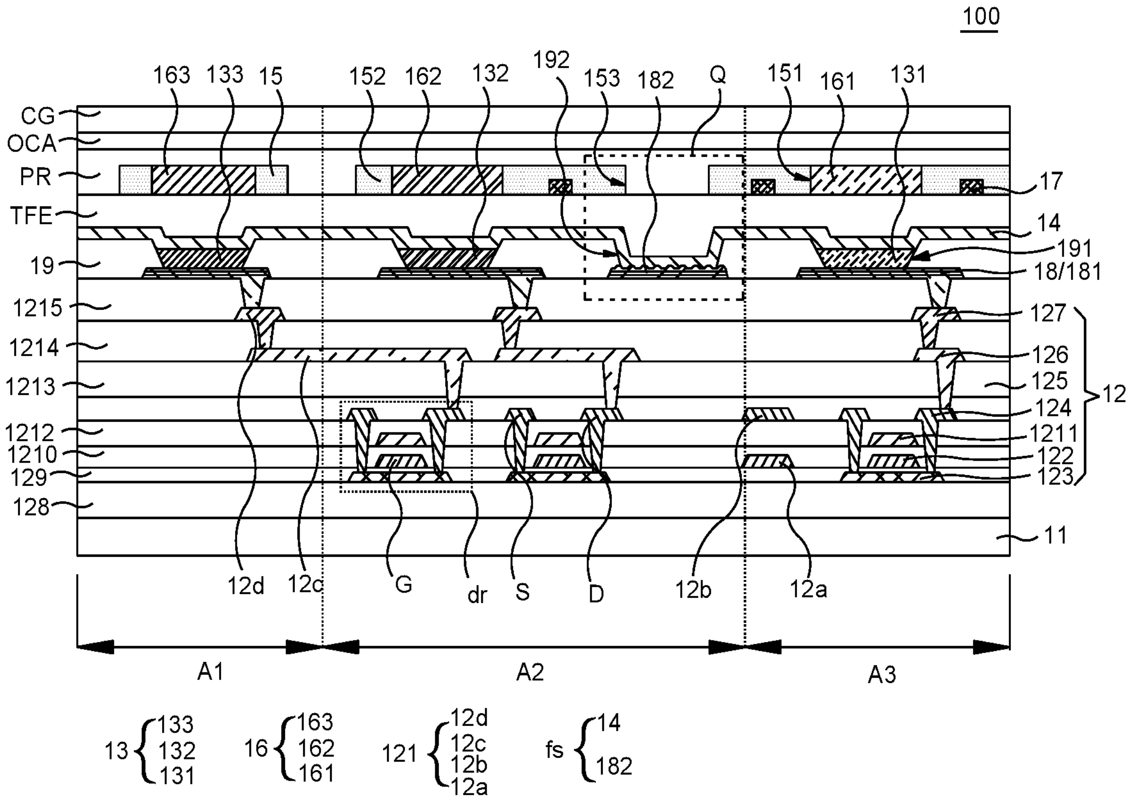
FIG. 6 is a schematic sectional view of a display panel according to another embodiment of the present disclosure.

Referring to FIG. 6, Embodiment 2 differs from Embodiment 1 in that reflection parts 182 directly faces the third openings 153, to improve the reflectivity of the transition region A2. A portion of the wiring 121 may directly face the third openings 153, or may bypass the third openings 153.

Embodiment 2 in which the reflection parts 182 directly faces the third openings 153 and the wiring 121 may bypass the third openings 153 is described as an example.

The reflection structure fs further includes the reflection parts 182 disposed in the same layer as the anodes 181, and the anodes 181 and the reflection parts 182 are disposed spaced apart from each other.

An orthographic projection of each reflection part 182 on a plane in which the substrate 11 is located is located inside an orthographic projection of an outline of each third opening 153 on the plane in which the substrate 11 is located.

In Embodiment 2, the reflection parts 182 are respectively disposed to correspond to the third openings 153. When a part of the external light is radiated onto the reflection parts 182 through the third openings 153 and the cathode 14, the external light is reflected by the reflection part 182 and is emitted thought the third openings 153, thereby improving the reflectivity of the transition region A2. In addition, compared with Embodiment 1, the reflection parts 182 are located closer to the third openings 153, so that the attenuation amount of light is reduced, and the brightness of the reflected light is improved.

In addition, since the reflectivity of the reflection parts 182 is large, the reflectivity of the whole device can be improved by using a portion of the cathode 14 and the reflection parts 182, so that a size of each of the third openings 153 can be reduced. In the case that the size of each of the third openings 153 is reduced, the length of each second touch wire 172 surrounding each third opening 153 can be reduced, thereby reducing the influence of the second touch wires 172 on the capacitance and resistance of the touch electrodes 17.

Alternatively, the reflection parts 182 and the anodes 181 have the same material and may be formed using the same mask plate.

Alternatively, each of the reflection parts 182 includes a metal reflection layer 18*a*. The metal reflection layer 18*a* may include silver.

Each of the reflection parts 182 may also include a first metal oxide layer 18*b* and a second metal oxide layer 18*c*. The metal reflection layer 18*a* is disposed between the first metal oxide layer 18*b* and the second metal oxide layer 18*c*.

Alternatively, each of the first metal oxide layer 18*b* and the second metal oxide layer 18*c* may include transparent conductive materials such as indium tin oxide, indium zinc oxide, or the like.

Figure 7:
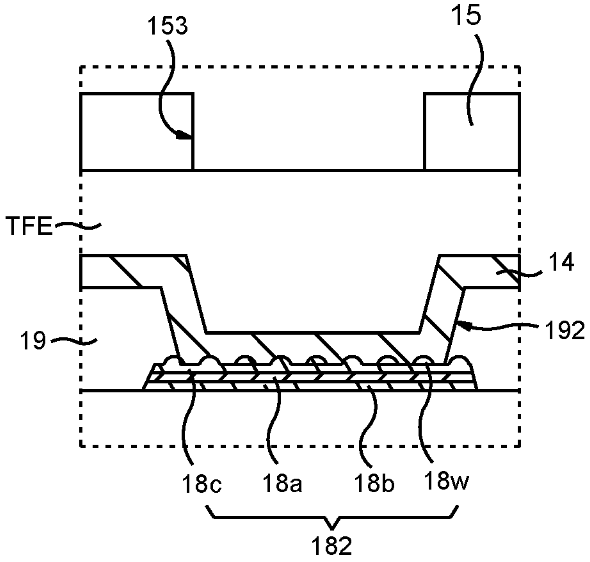
FIG. 7 is an enlarged view of part Q in FIG. 5.

Referring to FIG. 7, alternatively, microstructures 18*w* are formed on a side of each reflection part 182 away from the substrate 11. The microstructures 18*w* have a scattering effect so that the external light is diffusely reflected by the reflection parts 182, thereby improving the uniformity of the reflected light and reducing the particle sensation.

The microstructures 18*w* may be formed on the metal reflection layer 18*a*, or may be formed on the first metal oxide layer 18*b* or the second metal oxide layer 18*c*.

In this embodiment, contact holes 192 may be disposed in the pixel definition layer 19. The contact holes 192 respectively expose the reflection parts 182. The cathode 14 covers the pixel definition layer 19 and is connected to the reflection parts 182 through the contact holes 192.

The cathode 14 is connected to the reflection parts 182 to reduce the voltage drop of the cathode 14. That is, the reflection parts 182 serves not only to reflect the external light, but also to act as an auxiliary cathode.

In the present embodiment, the microstructures 18*w* are formed on a side of each reflection part 182 away from the substrate 11, so that the effect of diffuse reflection is achieved, the stability of the connection with the cathode 14 is improved.

Alternatively, the contact holes 192 are disposed corresponding to the third openings 153, thereby saving the space.

Embodiment 3

Figure 8:
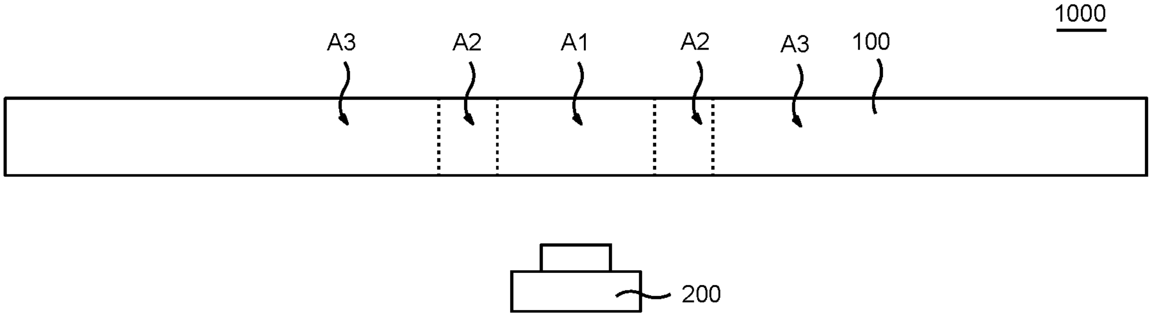
FIG. 8 is a schematic structural view of a display device according to an embodiment of the present disclosure.

Referring to FIG. 8, in an embodiment of the present disclosure, a display device 1000 includes a photosensitive device 200 and a display panel 100 according to any one of the above embodiments. The photosensitive device 200 is disposed on the rear of the display panel 100 and corresponds to the light transmission region A1.

It should be noted that the display panel 100 of the display device 1000 according to this embodiment has the same structure as or similar to that of the display panel 100 of Embodiment 1 or Embodiment 2. Therefore, the above description may be applied to the display panel 100 according to Embodiment 3, and details are not described herein.

The rear of the display panel 100 refers to a side opposite to the light-emitting surface of the display panel 100.

Alternatively, the photosensitive device 200 may be a camera, a fingerprint recognition device, or the like.

In the display device 1000 according to embodiments of the present disclosure, the third openings 153 are disposed in a region of the black matrix layer 15 corresponding to the transition region A2, so that external light can be reflected by the cathode 14 through the third openings 153, to form reflected light, thereby increasing the light reflectivity of the transition region A2 and improving the dimmer transition region when the panel is screen-off and screen-on.

The foregoing describes in detail a display panel and a display device according to some embodiments of the present disclosure. The principles and embodiments of the present disclosure are described herein using specific examples. The description of the above embodiments is merely provided to help understand the method of the present disclosure and the core idea thereof. At the same time, variations will occur to those skilled in the art in both the detailed description and the scope in accordance with the technical concept of the present disclosure. In sum, the present description should not be construed as limiting the application.

What is claimed is:

1. A display panel comprising:

a first display region;

a component region surrounded by the first display region, wherein the component region comprises at least one transmission region and at least one second display region, and one of the at least one transmission region is transparent and arranged to correspond to an external photosensitive device under the display panel and surrounded by the at least one second display region between the one of the at least one transmission region and the first display region;

one or more sub-pixels disposed in each of the first display region and the second display region, wherein the one or more sub-pixels in each of the first display region and the second display region include red sub-pixels, green sub-pixels, and blue sub-pixels, the red sub-pixels in the first display region are arranged in a same red pixel arrangement as that in the second display region, the green sub-pixels in the first display region are arranged in a same green pixel arrangement as that in the second display region, and the blue sub-pixels in the first display region are arranged in a same blue pixel arrangement as that in the second display region;

a black matrix layer disposed in the first and second display regions and not disposed in the light transmission region, wherein the black matrix layer comprises first openings respectively overlapping the one or more sub-pixels in the first display region and the one or more sub-pixels in the second display region and one or more second openings without overlapping the one or more sub-pixels in each of the first display region and the second display region; and touch wires disposed in the first display region and the second display region, and surrounding at least one of the first openings and respective ones of the second openings, wherein the touch wires comprises: a row touch wire extending along a first direction parallel with a row direction of the display panel; a column touch wire extending along a second direction different from the first direction; first touch wires respectively arranged to enclose more than one of the first openings corresponding to ones of the one or more sub-pixels in the first display region and the one or more sub-pixels in the second display region for emitting light of a same color; and second touch wires respectively arranged to enclose the second openings between adjacent two ones of the first touch wires, and wherein the first touch wires are spaced apart from each other and are electrically connected through the row touch wire and the column touch wire and the second touch wires are spaced apart from each other and are electrically connected through the row touch wire and/or the column touch wire with the first touch wire therebetween, wherein the first touch wire and the second touch wire are electrically connected through the row touch wire and/or the column touch wire.

2. The display panel of claim 1, wherein each of the one or more sub-pixels in each of the first display region and the second display region has a circular shape.

3. The display panel of claim 1, wherein the first touch wire and the second touch wire are alternately arranged in the first direction and connected through the row touch wire.

4. The display panel of claim 1, wherein each of the first touch wires and the second touch wires has a quadrilateral shape.

5. The display panel of claim 4, wherein each of the first touch wires and the second touch wires has a diamond shape formed by a first line and a second line, the first line extending along a third direction between the first direction and the second direction in a plan view, and the second line extends along a fourth direction between the first direction and the second direction in the plan view, and wherein the fourth direction is different from the third direction.

6. The display panel of claim 1, further comprising:

a substrate;

a light-emitting layer disposed on the substrate and comprising the one or more sub-pixels in each of the first display region and the second display region;

the touch wire disposed on the light-emitting layer;

the black matrix layer disposed on the light-emitting layer and covering the touch wire; and a metal layer disposed between the light-emitting layer and the substrate, wherein the metal layer at least partially overlaps a third opening.

7. The display panel of claim 6, wherein the metal layer comprises at least one of a plurality of conductive film layers between the substrate and the black matrix layer.

8. The display panel of claim 1, wherein the second opening and the first opening are alternately arranged in the first direction and the first touch wire and the second touch wires are spaced apart from each other and alternately arranged in the first direction, and wherein each of the second openings is between adjacent ones of the green sub-pixels in the first direction.

9. The display panel of claim 8, wherein each of the second openings is disposed between adjacent ones of the first openings in the first direction.

10. The display panel of claim 1, wherein the second touch wire is connected to the first touch wire via the row touch wire between the second touch wire and the first touch wire.

11. A display device comprising a photosensitive device and a display panel, wherein the display panel comprises:

a first display region;

a component region surrounded by the first display region, wherein the component region comprises at least one transmission region and at least one second display region, one of the at least one transmission region is transparent and surrounded by the at least one second display region between the one of the at least one transmission region and the first display region, and the photosensitive device is disposed under the display panel in the one of the at least one transmission region;

one or more sub-pixels disposed in each of the first display region and the second display region, wherein the one or more sub-pixels in each of the first display region and the second display region include red sub-pixels, green sub-pixels, and blue sub-pixels, the red sub-pixels in the first display region are arranged in a same red pixel arrangement as that in the second display region, the green sub-pixels in the first display region are arranged in a same green pixel arrangement as that in the second display region, and the blue sub-pixels in the first display region are arranged in a same blue pixel arrangement as that in the second display region;

a black matrix layer disposed in the first and second display regions and not disposed in the light transmission region, wherein the black matrix layer comprises first openings respectively overlapping the one or more sub-pixels in the first display region and the one or more sub-pixels in the second display region and one or more second openings without overlapping the one or more sub-pixels in each of the first display region and the second display region; and touch wires disposed in the first display region and the second display region, and surrounding respective ones of the first openings and respective ones of the second openings, wherein the touch wires comprises: a row touch wire extending along a first direction parallel with a row direction of the display panel; a column touch wire extending along a second direction different from the first direction; first touch wires respectively arranged to enclose more than one of the first openings corresponding to ones of the one or more sub-pixels in each of the first display region and the second display region for emitting light of a same color in the first display region and the second display region; and second touch wires respectively arranged to enclose the second openings between adjacent two ones of the first touch wires, and wherein the first touch wires are spaced apart from each other and are electrically connected through the row touch wire and the column touch wire and the second touch wires are spaced apart from each other and are electrically connected through the row touch wire and/or the column touch wire with the first touch wire therebetween, wherein the first touch wire and the second touch wire are electrically connected through the row touch wire and/or the column touch wire.

12. The display device of claim 11, wherein each of the one or more sub-pixels in each of the first display region and the second display region has a circular shape.

13. The display device of claim 11, wherein the first touch wire and the second touch wire are alternately arranged in the first direction and connected through the row touch wire.

14. The display device of claim 11, wherein each of the first touch wires and the second touch wires has a quadrilateral shape.

15. The display device of claim 14, wherein each of the first touch wires and the second touch wires has a diamond shape formed by a first line and a second line, the first line extending along a third direction between the first direction and the second direction in a plan view, and the second line extends along a fourth direction between the first direction and the second direction in the plan view, and wherein the fourth direction is different from the third direction.

16. The display device of claim 11, wherein the display panel further comprising:

a substrate;

a light-emitting layer disposed on the substrate and comprising the one or more sub-pixels in the first display region and the one or more sub-pixels in the second display region;

the touch wire disposed on the light-emitting layer;

the black matrix layer disposed on the light-emitting layer and covering the touch wire; and a metal layer disposed between the light-emitting layer and the substrate, wherein the metal layer at least partially overlaps a third opening.

17. The display device of claim 16, wherein the metal layer comprises at least one of a plurality of conductive film layers between the substrate and the black matrix layer.

18. A display panel comprising:

a first display region;

a component region surrounded by the first display region, wherein the component region comprises at least one transmission region and at least one second display region surrounding the transmission region and the at least one transmission region is transparent;

one or more sub-pixels disposed in each of the first display region and the second display region, wherein the one or more sub-pixels in each of the first display region and the second display region include red sub-pixels, green sub-pixels, and blue sub-pixels, the red sub-pixels in the first display region are arranged in a same red pixel arrangement as that in the second display region, the green sub-pixels in the first display region are arranged in a same green pixel arrangement as that in the second display region, and the blue sub-pixels in the first display region are arranged in a same blue pixel arrangement as that in the second display region;

a black matrix layer disposed in the first and second display regions and not disposed in the light transmission region, wherein the black matrix layer comprises first openings respectively overlapping the one or more sub-pixels in each of the first display region and the second display region and one or more second openings spaced apart from the first openings, wherein sub-pixels of the display panel including the one or more sub-pixels in each of the first display region and the second display region all are disposed outside the second opening in a plan view of the display panel; and touch wires disposed in the first display region and the second display region, and surrounding respective ones of the first openings and respective ones of the second openings, wherein the touch wires comprises: a row touch wire extending along a first direction parallel with a row direction of the display panel; a column touch wire extending along a second direction different from the first direction; first touch wires respectively arranged to enclose more than one of the first openings corresponding to ones of the one or more sub-pixels in the first display region and the one or more sub-pixels in the second display region for emitting light of a same color; and second touch wires respectively arranged to enclose the second openings between adjacent two ones of the first touch wires, and wherein the first touch wires are spaced apart from each other and are electrically connected through the row touch wire and the column touch wire and the second touch wires are spaced apart from each other and are electrically connected through the row touch wire and/or the column touch wire with the first touch wire therebetween, wherein the first touch wire and the second touch wire are electrically connected through the row touch wire and/or the column touch wire.

* * * * *